United States Patent [19]

Pazos

[11] 4,198,242
[45] Apr. 15, 1980

[54] PHOTOPOLYMERIZABLE COMPOSITION CONTAINING AN O-NITROAROMATIC COMPOUND AS PHOTOINHIBITOR

[75] Inventor: José F. Pazos, Claymont, Del.

[73] Assignee: E. I. Du Pont de Nemours and Company, Wilmington, Del.

[21] Appl. No.: 913,906

[22] Filed: Jun. 8, 1978

Related U.S. Application Data

[63] Continuation-in-part of Ser. No. 758,699, Jan. 17, 1977, abandoned, which is a continuation-in-part of Ser. No. 667,536, Mar. 17, 1976, abandoned.

[51] Int. Cl.$^2$ .................................................. G03C 2/68
[52] U.S. Cl. .............................. 430/286; 204/199.18; 204/159.23; 430/910; 430/301
[58] Field of Search .................... 96/115 P, 35.1; 204/159.18; 204/159.23

[56] References Cited

U.S. PATENT DOCUMENTS

| | | | |
|---|---|---|---|
| 2,773,766 | 12/1956 | Sus et al. | 96/33 |
| 3,203,801 | 8/1965 | Heiart | 96/87 |
| 3,203,802 | 8/1965 | Burg | 96/87 |
| 3,458,311 | 7/1969 | Alles | 96/35.1 |
| 3,556,794 | 1/1971 | Margerum | 96/45.2 |
| 3,895,952 | 7/1975 | Schlesinger | 96/115 P |
| 3,901,705 | 8/1975 | Pazos | 96/35.1 |
| 3,901,710 | 8/1975 | Ranz et al. | 96/67 |
| 4,029,505 | 6/1977 | Nebe | 96/35.1 |
| 4,035,189 | 7/1977 | Hayashi et al. | 96/115 R |

OTHER PUBLICATIONS

Feuer, Interscience Pub., Part I, pp. 185–191 (1969).
Preston et al., Chem. Reviews, 72, No. 6, pp. 669–673 (1972).
Mayo et al., Quarterly Reviews, 15, pp. 414–416 (1961).
Margerum, J. Am. Chem. Soc., 87, No. 16, pp. 3772–3773 (1965).

*Primary Examiner*—Jack P. Brammer

[57] ABSTRACT

A photopolymerizable coating composition comprising
 (1) a nongaseous, ethylenically unsaturated, polymerizable compound,
 (2) a specified nitroaromatic compound, and
 (3) an organic, radiation-sensitive, free-radical generating system
is useful for making a positive or negative polymeric image on a substrate.

19 Claims, No Drawings

PHOTOPOLYMERIZABLE COMPOSITION CONTAINING AN O-NITROAROMATIC COMPOUND AS PHOTOINHIBITOR

CROSS-REFERENCE TO RELATED APPLICATIONS

This is a continuation-in-part of copending application Ser. No. 758,699, filed Jan. 17, 1977 now abandoned, which in turn is a continuation-in-part of application Ser. No. 667,536, filed Mar. 17, 1976, now abandoned.

BACKGROUND OF THE INVENTION (1) Field of the Invention

This invention relates to photopolymerizable compositions, and to methods of producing positive and negative polymeric images from these compositions.

(2) Description of the Prior Art

Conventional polymeric imaging systems are of the negative polymeric image type; that is, the photopolymerizable coating is exposed to radiation through a process transparency and a negative polymeric image is produced. By "negative polymeric image" is meant a polymeric image which corresponds to the transparent portions of the process transparency.

Recently systems which provide a positive polymeric image have been developed. One such system is described by Nebe in U.S. Pat. No. 4,029,505. In this system (a) a substrate is coated with a photopolymerizable composition containing
  (1) a nongaseous, ethylenically unsaturated, polymerizable compound,
  (2) 0.001 to 1.0 part by weight per part of polymerizable compound of an organic, radiation-sensitive, free-radical generating system, and
  (3) 0.1 to 10% by weight, based on the photopolymerizable composition, of a nitroso dimer
(b) the photopolymerizable coating is exposed through a process transparency to radiation at least some of which has a wavelength less than 3400 Å whereby the nitroso dimer is dissociated to a polymerization-inhibiting nitroso monomer in the radiation-struck areas, and
(c) a greater portion of the photopolymerizable coating is exposed to radiation substantially limited to wavelengths greater than 3400 Å whereby a positive polymeric image is formed in the areas struck by the second radiation but not struck by the first imagewise radiation.

Although this system can produce excellent positive polymeric images, a limited time factor is involved. The second exposure must be carried out soon after the first exposure since the nitroso monomer formed during the first exposure can recombine to form inactive nitroso dimer. It would also be desirable to have a system which is not dependent on exposure to such short wavelength radiation.

Another system for producing positive polymeric images is described by Margerum in U.S. Pat. No. 3,556,794. In this system, a photopolymerizable material comprising (1) an ethylenically unsaturated monomer,
(2) a photopolymerization initiator system comprising a photo-oxidant dye and a reducing agent for the dye, and
(3) an ionizable desensitizing agent having a nitrobenzyl moiety in combination with a carboxylate group, is imagewise exposed to radiation in the wavelength range of 2000–4000 Å, thereby inhibiting polymerization by the desensitization of the initiator system, and exposing the photopolymerizable material to radiation in the wavelength range of 3800 to 7200 Å, thereby producing a polymeric image in the area not exposed to the imagewise radiation. This system suffers from the drawback that the desensitizing effect of the desensitizing agent is only temporary. Margerum states that the desensitization lasts "for up to about fifteen or more minutes". In Example 1 the second exposure follows the imagewise exposure by 30 seconds.

SUMMARY OF THE INVENTION

This invention provides a photopolymerizable composition in which the photopolymerizable and photosensitive components consist essentially of (a) a normally nongaseous, ethylenically unsaturated compound capable of addition polymerization by free-radical initiated chain propagation,
(b) about 0.004 to about 0.7 part by weight, per part of component (a), of nitroaromatic compound of the formula

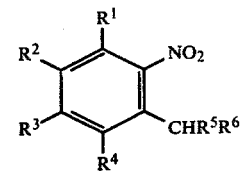

wherein $R^1$, $R^2$, $R^3$ and $R^4$, alike or different, are H, OH, halogen, $NO_2$, CN, alkyl of 1 to 18 carbons, alkoxy in which the alkyl is of 1 to 18 carbons, acyloxy of 2 to 7 carbons, aryl of 6 to 18 carbons, benzyl, halogen-substituted phenyl, polyether of 2 to 18 carbons and 2 to 10 oxygens, dialkylamino in which each alkyl is of 1 to 18 carbons, thioalkyl in which the alkyl is of 1 to 18 carbons, or thioaryl in which the aryl is of 6 to 18 carbons, $R^2$ and $R^3$, taken together, are $-OCH_2O-$ or $-O-(CH_2CH_2O)_q-$ in which q is an integer from 1 to 5, or any two of $R^1$, $R^2$, $R^3$ and $R^4$, taken together, are the residue of a second benzene ring fused into the benzene nucleus, with the proviso that not more than one of $R^1$, $R^2$, $R^3$ and $R^4$ is OH or $NO_2$, $R^5$ is H, alkyl of 1 to 18 carbons, halogen, phenyl, or alkoxy in which the alkyl is of 1 to 18 carbons, $R^6$ is H, OH, alkyl of 1 to 18 carbons, phenyl, alkoxy in which the alkyl is of 1 to 18 carbons, or aryloxy of 6 to 18 carbons unsubstituted or substituted with halogen, alkyl of 1 to 6 carbons, or alkoxy of 1 to 6 carbons, with the proviso that only one of $R^5$ and $R^6$ is H, or $R^5$ and $R^6$ together are $=O$, $=CH_2$, $-O-CH_2-$, $=NC_6H_5$, $=NC_6H_4N(alkyl)_2$ in which each alkyl is of 1 to 18 carbons, $-O-C_2H_4-O-$, $=N(alkyl)$ in which the alkyl is of 1 to 6 carbons, $=N(hydrocarbylene)$

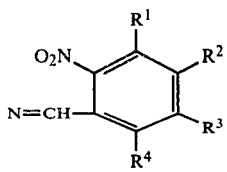

in which the hydrocarbylene group is of 1 to 18 carbons, or

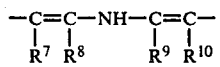

in which $R^8$ and $R^9$, alike or different, are H or alkyl of 1 to 4 carbons, and $R^7$ and $R^{10}$, alike or different, are —CN, —$COR^{11}$ in which $R^{11}$ is alkyl of 1 to 5 carbons, or —$COOR^{12}$ in which $R^{12}$ is alkyl of 1 to 6 carbons which may be interrupted by an oxygen atom, alkenyl of 2 to 5 carbons, or alkynyl of 2 to 5 carbons, or $R^7$ and $R^8$ together, or $R^9$ and $R^{10}$ together, complete a 6-membered carbocyclic ring containing a keto group, and (c) about 0.001 to about 10 parts by weight, per part of component (a), of an organic, radiation-sensitive, free-radical generating system, activatable by actinic radiation that does not significantly rearrange the nitroaromatic compound to an inhibitor of free-radical polymerization.

Preferably components (a), (b) and (c), in combination, comprise about 15–100% by weight of the photopolymerizable composition.

Positive polymeric images are produced on a substrate by the process which comprises (1) coating the substrate with the above photopolymerizable composition, (2) imagewise exposing a portion of the photopolymerizable coating through an image-bearing transparency to radiation at least about 20% of which has a wavelength of about 200 to about 380 nm, thereby rearranging at least some of the nitroaromatic compound to polymerization-inhibiting nitrosoaromatic compound, and (3) subjecting the coating to a second exposure whereby a greater portion of the coating, including the portion exposed during the imagewise exposure, is exposed to radiation substantially limited to wavelengths greater than about 380 nm, whereby a positive polymeric image is formed in the areas exposed during the second exposure, but not exposed during the imagewise exposure. The image formed in step (3) is developed by removing the nonpolymerized portion of the photopolymerizable coating in the areas exposed to the imagewise exposure radiation, or by differential adhesion of a pigment toner to the unpolymerized portion of the photopolymerizable coating in the areas exposed to the imagewise exposure radiation.

Negative polymeric images are produced on a substrate by the process which comprises (1) coating the substrate with the above photopolymerizable composition, and (2) imagewise exposing a portion of the photopolymerizable coating through an image-bearing transparency to radiation substantially limited to wavelengths greater than about 380 nm, whereby a negative polymeric image is formed in the areas exposed to to the radiation.

DESCRIPTION OF THE PREFERRED EMBODIMENTS

In a preferred embodiment of the photopolymerizable coating composition, component (a) is an unsaturated ester of a polyol and an α-methylenecarboxylic acid selected from the group consisting of acrylic and methacrylic acids, any alkyl groups in component (b) are of 1 to 6 carbons, and component (c) has at least one component having an active radiation absorption band with a molar extinction coefficient of at least about 50 within the range of greater than 380 to 800 nm, and most preferably within the range of 400 to 600 nm, and is selected from the group consisting of phenanthrenequinones and 2,4,5-triarylimidazolyl dimers. Preferably component (b) is present in the amount of about 0.04 to about 0.15 part by weight of component (a), and component (c) is present in the amount of about 0.01 to about 2 parts by weight per part of component (a).

In a preferred embodiment of the method of making positive polymeric images at least about 30% of the radiation in the imagewise exposure has a wavelength of about 200 to about 380 nm, and the radiation in the second exposure has wavelengths substantially limited to greater than about 380 to about 800 nm, and most preferably substantially limited to about 400 to about 600 nm.

This invention is based on the discovery that certain nitroaromatic compounds in which the nitro group is ortho to a hydrogen-bearing alpha-carbon substituent do not significantly retard or inhibit free-radical polymerization in certain photopolymerizable systems, but are photochemically rearranged to nitrosoaromatic inhibitors of free-radical polymerization by exposure to radiation having a wavelength of about 200 to about 380 nm. These nitroaromatic compounds are relatively unaffected by radiation of longer wavelength. On the other hand, certain radiation-sensitive, free-radical initiators absorb radiation of longer wavelength, especially in the presence of added sensitizers, to provide sufficient radicals for polymerization of a polymerizable monomer in the absence of an appreciable concentration of inhibiting nitrosoaromatic species.

The nitroso compounds formed by irradiation of the nitroaromatic compounds described herein with short wavelength radiation interfere with the normal free-radical induced polymerization process. Thus, when using the shorter wavelength region of the spectrum in the presence of a nitrosoaromatic compound, an insufficient number of initiating and propagating free radicals is available, and polymerization does not occur. When a composition of this invention is exposed to radiation of wavelength greater than about 380 nm, the nitroaromatic compound is relatively unaffected, and the photoinitiator system operates to produce initiating radicals. These radicals are able to effect chain propagation in the usual way and polymerization occurs.

Suitable polymerizable compounds for use as component (a) of the photopolymerizable coating compositions of this invention are the normally nongaseous, ethylenically unsaturated compounds described by Burg et al. in U.S. Pat. No. 3,060,023; Martin et al., in U.S. Pat. No. 2,927,022; and Hertler in U.S. Pat. No. 3,871,885. By "normally nongaseous" is meant compounds which are not gases under atmospheric conditions. They are preferably monomeric, have a boiling point above 90° C. at normal atmosphere pressure, and contain at least one terminal ethylenic group, but most preferably contain 2–5 terminal ethylenic groups.

Suitable polymerizable compounds include unsaturated esters of polyols, particularly such esters of α-methylenecarboxylic acids, for example, ethylene glycol diacrylate, diethylene glycol diacrylate, glycerol diacrylate, glyceryl triacrylate, mannitol polyacrylate, sorbitol polyacrylates, ethylene glycol dimethacrylate, 1,3-propanediol dimethacrylate, 1,2,4-butanetriol trimethacrylate, 1,1,1-trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerylthritol di-, tri-, and tetraacrylates, 1,3-propanediol diacrylate, 1,5-pentanediol dimethacrylate, the bis-acrylates and methacrylates of polyethylene glycols of molecular weight 200–4000, and the like; unsaturated amides, particularly those of α-methylenecarboxylic acids, and especially those of α,ω-diamines and oxygen-interrupted ω-diamines, such as methylene bis-acrylamide, methylene bis-methacrylamide, ethylene bis-methacrylamide, 1,6-hexamethylene bis-acrylamide, bis(γ-methacrylamidopropoxy)-ethane and β-methacrylamidoethyl methacrylate; vinyl esters such as divinyl succinate, divinyl adipate, divinyl phthalate, divinyl terephthalate, divinyl benzene-1,3-disulfonate and divinyl butane-1,4-disulfonate; unsaturated aldehydes, such as hexadienal; and the like; and mixtures thereof.

A preferred group of polymerizable compounds, because of the good physical properties of compositions containing them, includes N-phenyl-N-methylacrylamide,
N-vinylphthalimide,
diacetone acrylamide,
N-vinylsuccinimide,
p-xylylene diacrylate,
1,4-bis(2-acryloxyethyl)benzene,
pentaerythritol triacrylate,
4-acryloxybenzophenone,
4-methacryloxybenzophenone,
N-(2-acryloxyethyl)succinimide,
1,1,1-trimethylolpropane triacrylate,
pentaerythritol tetraacrylate,
triethylene glycol diacrylate,
triethylene glycol dimethacrylate,
1,1,1-trimethylolpropane trimethacrylate,
4-acryloxydiphenylmethane,
N-(2-acryloxypropyl)succinimide,
2,4-diacryloxybenzophenone,
4-(α,α-dimethylbenzyl)phenyl acrylate,
3-acryloxybenzophenone,
2-acryloxybenzophenone,
2-acryloxy-4-octyloxybenzophenone, and mixtures thereof. The most preferred polymerizable compounds are esters of α-methylenecarboxylic acids selected from the group consisting of acrylic and methacrylic acids.

Many of the polymerizable compounds listed above are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared, as was done in the examples which follow. The resulting compositions usually have satisfactory thermal stability. If unusual thermal exposure is anticipated, or if monomers containing little or no thermal polymerization inhibitor are employed, compositions with adequate shelf life can be obtained by incorporating up to 5 percent, by weight of monomer, of a thermal polymerization inhibitor such as hydroquinone, methylhydroquinone, p-methoxyphenol, the nitroso dimer inhibitor systems described in British Pat. No. 1,453,681, and the like.

The photopolymerizable coating compositions also contain a nitroaromatic compound of the formula described above. In this formula, the preferred alkyl groups are lower alkyl groups containing 1 to 6 carbon atoms. In the bis compounds, the term "hydrocarbylene" represents any divalent radical composed solely of carbon and hydrogen con-containing 1 to 18 carbon atoms. Typical radicals include o-, m-, and p- phenylene, vinylene, 2-butynylene, 1,3-butadienylene, hexamethylene, octamethylene, octadecamethylene, naphthylene (1,2; 2,3; 1,4; and 1,5),

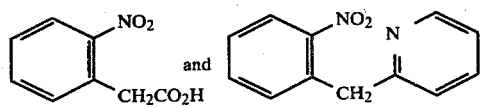

and the like.

It has been found that the nature of the $R^5$ and $R^6$ substituents in the nitroaromatic compounds is very important. The unsubstituted compounds in which $R^5$ and $R^6$ are H do not seem to work satisfactorily. Furthermore, some $R^5$ and $R^6$ substituents deactivate the CH moiety toward rearrangement, for example, substituents which are normally considered to destabilize positive charges, such as nitro, cyano, carboxy and 2-pyridyl. It has been found, for instance, that

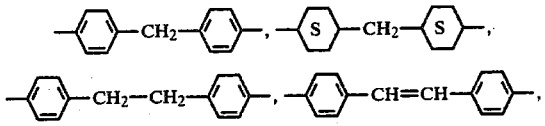

do not work in accordance with this invention.

Preferred nitroaromatic compounds include those wherein $R^1$ is H or methoxy;

$R^2$ and $R^3$ are H, alkoxy of 1 to 6 carbons, polyether of 2 to 18 carbons and 2 to 10 oxygens, alkyl of 1 to 6 carbons, or acetoxy; or $R^2$ and $R^3$, taken together, are —OCH$_2$O— or —O(CH$_2$CH$_2$O)$_5$;

$R^4$ is H;

$R^5$ is H, alkyl of 1 to 6 carbons, alkoxy of 1 to 6 carbons, or phenyl;

$R^6$ is OH, alkoxy of 1 to 6 carbons, or phenoxy substituted with up to three chlorines, alkyls of 1 to 6 carbons, or alkoxys of 1 to 6 carbons; or $R^5$ and $R^6$, taken together, are =O, =NC$_6$H$_5$, =N(hydrocarbylene)

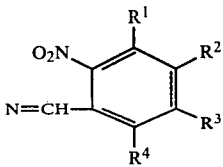

in which the hydrocarbylene group is of 2 to 6 carbons, =N (alkyl) in which alkyl is n-alkyl of 1 to 6 carbons or t-butyl, or

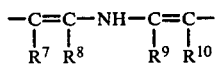

in which $R^8$ and $R^9$ are alike and are H or methyl, and $R^7$ and $R^{10}$ are alike and are —CN, —$COR^{11}$ in which $R^{11}$ is methyl or ethyl, or —$COOR^{12}$ in which $R^{12}$ is methyl or ethyl.

Particularly preferred, because the instant compositions exhibit high imaging speeds, are nitroaromatic compounds wherein $R^1$ and $R^4$ are H;
$R^2$ and $R^3$ are alike and are alkoxy of 1 to 6 carbons;
$R^5$ is H, or alkyl of 1 to 6 carbons;
$R^6$ is alkoxy of 1 to 6 carbons, or phenoxy substituted with up to two alkoxys of 1 to 6 carbons; or $R^5$ and $R^6$, taken together, are =O or =$NC_6H_5$.

Specific nitroaromatic compounds which are suitable include:
o-nitrobenzyl alcohol,
o-nitrobenzaldehyde,
α-phenyl-o-nitrobenzyl alcohol,
o-(diphenylmethyl)nitrobenzene,
α-phenylimino-o-nitrotoluene,
α,α-diethoxy-o-nitrotoluene,
α,α-ethylenedioxy-o-nitrotoluene,
3-methoxy-2-nitrobenzaldehyde,
4-methoxy-2-nitrobenzaldehyde,
3,4-dimethoxy-2-nitrobenzaldehyde,
3,4-dimethoxy-2-nitrobenzyl alcohol,
4-cyano-2-nitrobenzaldehyde,
5-hydroxy-2-nitrobenzaldehyde,
4-hydroxy-3-methoxy-2-nitrobenzaldehyde,
1-nitro-2-naphthaldehyde,
2,3,4,5-tetramethyl-6-nitrobenzyl alcohol,
3,4,5-trichloro-2-nitrobenzaldehyde,
3,5-dibromo-4,6-dichloro-2-nitrobenzaldehyde,
4,5-dimethoxy-2-nitrobenzyl alcohol,
4,5-dimethoxy-2-nitrobenzaldehyde,
2,4-dinitrobenzaldehyde,
5-tolyl-2-nitrobenzaldehyde,
5-benzyl-2-nitrobenzaldehyde,
5-(m-chlorophenyl)-2-nitrobenzaldehyde,
4-(2-methoxyethoxy)-2-nitrobenzaldehyde,
4-ethoxyethyl-2-nitrobenzaldehyde,
3-diethylamino-2-nitrobenzaldehyde,
4-butylthio-2-nitrobenzaldehyde,
4-phenylthio-2-nitrobenzaldehyde,
2-nitrostyrene,
4,5-dimethoxy-2-nitrostyrene,
α-(p-dimethylaminophenyl)imino-2-nitrotoluene,
4,5-dimethoxy-2-nitro-α-phenyliminotoluene,
2-nitrostyrene oxide,
2-nitrocumene,
4,5-dimethoxy-2-nitrobenzyl chloride,
α,α-ethylenedioxy-2-nitrotoluene,
N,N'-bis(4,5-dimethoxy-2-nitrophenylmethylene)-1,6-hexanediamine,
N,N'-bis(2,4-dinitrophenylmethylene)-2,5-dimethyl-2,5-hexanediamine,
N,N'-bis(4,5-dimethoxy-2-nitrophenylmethylene)-m-phenylenediamine,
N,N'-bis(4,5-dimethoxy-2-nitrophenylmethylene)-p-phenylenediamine
N,N'-bis(4,5-dimethoxy-2-nitrophenylmethylene)-α,α'-bi-p-toluidine,
N,N'-bis(4,5-dimethoxy-2-nitrophenylmethylene)-4,4'-stilbenediamine,
dimethyl ester of 2,6-dimethyl-4-(2'-nitrophenyl)-1,4-dihydropyridine-3,5-dicarboxylic acid,
diethyl ester of 2,6-dimethyl-4-(2'-nitrophenyl)-1,4-dihydropyridine-3,5-dicarboxylic acid,
diethyl ester of 2,6-dimethyl-4-(2'-nitro-4',5'-dimethoxyphenyl)-1,4-dihydropyridine-3,5-dicarboxylic acid,
di-n-propyl ester of 2,6-dimethyl-4-(2'-nitrophenyl)-1,4-dihydropyridine-3,5-dicarboxylic acid,
diisopropyl ester of 2,6-dimethyl-4-(2'-nitrophenyl)-1,4-dihydropyridine-3,5-dicarboxylic acid,
di(β-ethoxyethyl)ester of 2,6-dimethyl-4-(2'-nitrophenyl)-1,4-dihydropyridine-3,5-dicarboxylic acid,
diallyl ester of 2,6-dimethyl-4-(2'-nitrophenyl)-1,4-dihydropyridine-3,5-dicarboxylic acid,
dipropargyl ester of 2,6-dimethyl-4-(2'-nitrophenyl)-1,4-dihydropyridine-3,5-dicarboxylic acid,
3-methyl-5-ethyl ester of 2,6-dimethyl-4-(2'-nitrophenyl)-1,4-dihydropyridine-3,5-dicarboxylic acid,
3-isopropyl-5-methyl ester of 2,6-dimethyl-4-(2'-nitrophenyl)-1,4-dihydropyridine-3,5-dicarboxylic acid,
ethyl ester of 4-(2'-nitrophenyl)-2,6-dimethyl-3-aceto-1,4-dihydropyridine-5-carboxylic acid,
2,6-dimethyl-4-(2'-nitrophenyl)-3,5-diaceto-1,4-dihydropyridine,
2,6-dimethyl-4-(2'-nitrophenyl)-3,5-dicyano-1,4-dihydropyridine,
ethyl ester of 2-methyl-4-(2'-nitrophenyl)-1,4,5-6,7,8-hexahydro-5-oxoquinoline-3-carboxylic acid,
methyl ester of 2-methyl-4-(2'-nitrophenyl)-1,4,5,6,7,8-hexahydro-5-oxoquinoline-3-carboxylic acid,
isopropyl ester of 2-methyl-4-(2'-nitrophenyl)-1,4,5,5,6,8-hexahydro-5-oxoquinoline-3-carboxylic acid,
1,2,3,4,5,6,7,8,9,10-decahydro-9-(2'-nitrophenyl)-1,8-dioxoacridine,
1,2,3,4,5,6,7,8,9,10-decahydro-3,3,6,6-tetramethyl-9-(2'-nitrophenyl)-1,8-dioxoacridine,
1-(2'-nitro-4',5'-dimethoxy)phenyl-1-(4-methoxyphenoxy)ethane,
1-(2'-nitro-4',5'-dimethoxy)phenyl-1-phenoxyethane,
1-(2'-nitro-4',5'-dimethoxy)phenyl-1-(2,4-dimethylphenoxy)ethane,
1-(2'-nitro-4',5'-dimethoxy)phenyl-1-(4-chlorophenoxy)ethane,
1-(2'-nitro-4',5'-dimethoxy)phenyl-1-(4-bromophenoxy)ethane,
1-(2'-nitro-4',5'-dimethoxy)phenyl-1-(2-naphthyloxy)ethane,
1-(2'-nitro-4',5'-dimethoxy)phenyl-1-(2,4-dimethoxyphenoxy)ethane,
1-(2'-nitro-4',5'-dimethoxy)phenyl-1-(4-t-butylphenoxy)ethane, 1-(2'-nitro-4',5'-dimethoxy)phenyl-1-(2-t-butyl-phenoxy)ethane,
2-nitro-4,5-dimethoxy-α-methyliminotoluene,
2-nitro-4,5-dimethoxy-α-t-butyliminotoluene,
2-nitro-4,5-dimethoxy-α-n-butyliminotoluene,
2-nitro-4,5-dimethoxy-α-n-hexyliminotoluene, and
1-(2'-nitro-4',5'-dimethoxy)phenyl-1-(2,4,5-trimethyl-phenoxy)ethane.

The nitroaromatic compounds are ordinarily employed in concentrations of about 0.004 to about 0.7 part by weight per part of polymerizable compound. The preferred amount in any specific case will depend upon the particular monomer/free-radical generating system employed. In general, the preferred amount of nitroaromatic compound is about 0.04 to about 0.15 part by weight per part of polymerizable compound.

The third component which the photopolymerizable coating composition must contain is an organic, radiation-sensitive, free-radical generating system which initiates polymerization of the monomer and does not subsequently terminate the polymerization. The word "organic" is used here and in the claims to designate compounds which contain carbon, and one or more of oxygen, hydrogen, nitrogen, sulfur and halogen, but are free of metal.

The free-radical generating system absorbs actinic radiation with wavelengths within the range of about 200 to about 800 nm that does not significantly rearrange the nitroaromatic compound to an inhibitor of free-radical polymerization. By "actinic radiation" is meant radiation which is active to produce the free radicals necessary to initiate polymerization of the monomeric material. The free-radical generating system can comprise one or more compounds which directly furnish free radicals when activated by radiation. It can also comprise a plurality of compounds, one of which yields the free radicals after having been caused to do so by a sensitizer which is activated by the radiation. Preferably the free-radical generating system has at least one component having a radiation absorption band with a molar extinction coefficient of at least about 50 within the range of greater than about 380 to about 800 nm, and more preferably about 400 to about 600 nm.

A large number of free-radical generating compounds can be utilized in the practice of this invention including aromatic ketones such as benzophenone, Michler's ketone (4,4'-bis(dimethylamino)benzophenone), 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, phenanthrenequinone, 2,7-di-t-butylphenanthrenequinone, and other aromatic ketones; benzoin ethers such as benzoin methyl ether, benzoin ethyl ether and benzoin phenyl ether, methylbenzoin, ethylbenzoin and other benzoins; 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like disclosed in U.S. Pat. No. 3,479,185 and in British Pat. Nos. 997,396, published July 7, 1965, and 1,047,569, published Nov. 9, 1966.

The imidazolyl dimers may be used with hydrogen donors such as 2-mercaptobenzoxazole or 2-mercaptobenzothiazole, with or without sensitizers such as Michler's ketone, 2,5-bis(4'-diethylamino-2'-methylbenzylidene)cyclopentanone, and various dyes. Additional examples of suitable initiators are disclosed by Plambeck in U.S. Pat. No. 2,760,863. Redox systems, especially those involving dyes, may also be used. These include combinations such as Rose Bengal/2-dibutylaminoethanol; 2-o-chlorophenyl-4,5-di(m-methoxyphenyl)imidazolyl dimer/2-mercaptobenzoxazole; 2-o-chlorophenyl-4,5-di(m-methoxyphenyl)imidazolyl dimer/2-mercaptobenzothiazole; and the like.

A preferred group of free-radical generating systems characterized by good efficiency includes the phenanthrenequinones and 2,4,5-triarylimidazolyl dimers, with or without hydrogen donors such as 2-mercaptobenzoxazole, and 2-mercaptobenzthiazole, especially in the presence of sensitizers. Particularly preferred are free-radical generating systems which include (1) 2,4,5-triarylimidazolyl dimers with a hydrogen donor and a visible sensitizer such as those disclosed in U.S. Pat. No. 3,652,275, and (2) free-radical generators sensitive to visible radiation such as substituted phenanthrenequinones. The concentration of the free-radical generating system is about 0.001 to about 10.0 parts by weight per part of polymerizable compound, and preferably about 0.01 to about 2.0 parts by weight.

The coating compositions used herein can also contain other components, if desired. For example, the coating can be of the monomer/binder type containing additionally a thermoplastic macromolecular organic polymer binder. The coating can also be of the substantially dry, predominately crystalline type, described by Hertler in U.S. Pat. No. 3,871,885, wherein the coating contains a solid ethylenically unsaturated polymerizable compound, an organic, radiation-sensitive, free-radical generating system, and a nonpolymeric normally liquid or solid organic substance which does not inhibit polymerization, in addition to a suitable nitroaromatic compound.

Suitable thermoplastic macromolecular organic polymer binders for use in a monomer/binder system are described by Chang in U.S. Pat. No. 3,661,588, and include such polymeric types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and poly-α-alkylacrylate esters, e.g., polymethyl methacrylate and polyethyl methacrylate; (k) high molecular weight ethylene oxide polymers (polyethylene glycols) having average molecular weights from 4000–4,000,000; (l) polyvinyl chloride and copolymers; (m) polyvinyl acetal; (n) polyformaldehydes; (o) polyurethanes; (p) polycarbonates; and (q) polystyrenes.

In a particularly preferred embodiment of the invention, the polymeric binder is selected to that the unexposed photopolymerizable coating is soluble in predominantly aqueous solutions, for example dilute aqueous alkaline solutions, but upon exposure to actinic radiation becomes relatively insoluble therein. Typically, polymers which satisfy these requirements are carboxylated polymers, for example vinyl addition polymers containing free carboxylic acid groups. Another preferred group of binders includes polyacrylate esters and poly-α-alkylacrylate esters, particularly polymethyl methacrylate.

Although thermoplastic binders are normally employed, there can be added in addition to or instead of said binders nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins, melamine-formaldehyde resins, and the like.

When a monomer/binder system is employed, the amount of polymeric binder present is about 10 to about 80% by weight based on the total solids content, and preferably about 25% to about 75%. Polymerizable compounds which contain only one site of ethylenic unsaturation are generally not satisfactory for use in a monomer/binder system.

When the substantially dry, predominantly crystalline system, described in the Hertler patent cited above, is employed, in one aspect of the invention, the system may contain in addition to the polymerizable compound, about 0.01 to about 0.25 part by weight, per part of polymerizable compound, of a nonpolymeric, normally liquid organic compound which does not inhibit the polymerization of the polymerizable material and does not absorb so much of the incident radiation as to prevent the initiation of the polymerization by the free-radical generating system. In another aspect of the invention, the system may contain about 0.01 to about 250 parts by weight, per part of polymerizable compound, of a nonpolymerizable, crystalline organic solid which does not inhibit polymerization of the polymerizable compound and also does not absorb the incident radiation to such an extent as to prevent initiation of polymerization by the free-radical generating system.

Illustrative examples of suitable organic compounds which may be added include octadecanol, triethanolamine, stearic acid, cyclododecane, 1,10-decanediol, dimethylaminobenzonitrile, acetone oxime, desoxybenzoin, naphthalene, N,N'-dimethylhexamethylenediamine, p-diethoxybenzene, 1,2-diphenylethane, biphenyl, dotriacontane, tetramethylurea, tributylamine, 2-dimethylaminoethanol, pentamethylbenzene, 1,12-dodecanediol, 1,2-diphenoxyethane, octacosane, trichloroxylene, cyclododecanol, and the like. A preferred group of solid compounds includes bibenzyl, biphenyl, 1,2-diphenoxyethane, p-diethoxybenzene, octacosane, 1-octadecanol and cyclododecanol.

If desired, the photopolymerizable composition can also contain immiscible polymeric or nonpolymeric organic fillers or reinforcing agents which are essentially transparent at the wavelengths used for the exposures, e.g., the organophilic silicas, bentonites, silica, powdered glass and colloidal carbon, as well as various types of pigments. Such materials are used in amounts varying with the desired properties of the photopolymerizable composition. The fillers are useful in improving the strength of the compositions, reducing tack, and, in addition, as coloring agents. Other soluble additives which may also be employed include dyes and dispersing agents. A number of such ingredients are listed in U.S. Pat. Nos. 2,760,863; 3,060,026; and 3,203,805.

With certain polymers, it may be desirable to add a plasticizer to give flexibility to the resulting photopolymerizable layer and facilitate selective development. Suitable plasticizers include polyethylene glycols and related materials such as substituted phenol/ethylene oxide adducts, e.g., the polyethers obtained from o-, m-, and p-cresol, o-, m-, and p-phenylphenol and p-nonylphenol, including commercially available materials such as alkyl phenoxypolyoxethylene ethanols. Other plasticizers include the acetate, propionates, butyrates, caproates, caprylates and other carboxylate esters of ethylene glycol, diethylene glycol, glycerol, triethylene glycol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

The photopolymerizable compositions described herein may be coated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, alumina-blasted polyethylene terephthalate film, polyethylene terephthalate film, polyvinylidene chloride copolymer-coated oriented polyester film, gelatin-coated oriented polyester film, silicon wafers, polyvinyl alcohol-coated paper, crosslinked polyester-coated paper, nylon, glass, cellulose acetate film, heavy paper such as lithographic paper, and the like.

The particular substrate will generally be determined by the use application involved. For example, the compositions and method of this invention are particularly useful for producing printed circuits using as the substrate a plate which is a copper coating on fiberboard. When the photopolymerizable compositions are coated on metal surfaces, they are useful for making presensitized lithographic printing plates. For example, such a plate can be prepared from a grained aluminum base in combination with a photopolymerizable coating. After the image has been developed, the plate is first coated with water and then contacted with a roller which wets only the photopolymer image with ink. The inked plate can then be used in lithographic printing in the usual way. Preferably the substrate is impermeable to oxygen.

The coated compositions can also serve as photoresists in making etched or plated circuits or in chemical milling applications. They are also useful for preparing colored images from color separation negatives suitable for color-proofing. The images formed with these elements may also be used for making copies by thermal transfer to a substrate. Specific uses will be evident to those skilled in the art; many uses for positive images on substrates are disclosed in U.S. Pat. Nos. 2,760,863; 3,060,023; and 3,060,026.

Processes for coating the substrate are described in the patents listed in the preceding paragraph. Processes using coating compositions of the substantially dry, predominantly crystalline type are of five general types: those in which (1) the components of the coating composition are melted together generally to form a homogeneous melt which is coated onto the substrate; (2) the components of the coating composition are dissolved together in a solvent in which the components are preferably completely soluble and the resulting solution is poured or painted onto the substrate; (3) the components of the coating composition are dissolved in a volatile solvent and the resulting solution is sprayed as a fine mist against the substrate; (4) the components of the coating composition are melted together and the melt is sprayed as a fine mist onto the substrate; (5) the components of the coating composition are mixed together in a heated vessel which contains an inner surface that is cooled in which the distance from the mixture to the cooled, surface can be varied, whereby the components are sublimed onto the cooled surface. Further details of these processes can be found in the Hertler patent, cited above. A preferred coating method involves solution coating as in (2) above.

One of the special features of the photopolymerizable coating compositions of this invention is that they can be used to prepare either positive or negative polymeric images. Positive polymeric images are prepared by a two-exposure procedure while negative polymeric images are prepared by the one-exposure technique.

The compositions of the invention are exposed to radiation of wavelength in the 200–800 nm range. Suitable sources of such radiation, in addition to sunlight, include carbon arcs, mercury-vapor arcs, fluorescent lamps with ultraviolet radiation-emitting phosphors, argon and xenon glow lamps, electronic flash units, photographic-flood lamps, and lasers. Other fluorescent radiation sources such as the tracings on the face of a cathod ray tube may be used. Electron accelerators and electron beam sources through an appropriate mask may also be used.

Where artificial radiation sources are used, the distance between the photosensitive layer and the radiation source may be varied according to the radiation sensitivity of the composition and the nature of the photopolymerizable compound. Customarily, mercury-vapor arcs are used at a distance of 1.5 to 60 inches from the photopolymerizable layer. Radiation fluxes of 10–10,000 $\mu w/cm^2$ are generally suitable for use.

During the first exposure in preparing a positive polymer image, radiation having a wavelength of about 200 to about 380 nm is used, but is it not necessary that the wavelength be limited to this range. The radiation may have wavelengths over the entire range of about 200 to about 800 nm. In order to form an effective amount of inhibitor in the first exposure, at least about 20% of the radiation should be between about 200 and about 380 nm; and preferably at least about 30% of the radiation is within this range.

The radiation used during the second exposure should be substantially limited to wavelengths greater than about 380 nm. By "substantially limited" it is meant that the radiation is filtered to exclude greater than about 95% of the radiation at about 380 nm and below, or is otherwise limited to radiation greater than about 380 nm. Preferably, the radiation in the second exposure has wavelengths substantially limited to greater than about 380 to about 800 nm, and most preferably about 400 to about 600 nm.

Although all of the photopolymerizable compositions of this invention can be imaged with the second exposure radiation having wavelengths down to about 380 nm, shorter exposure times are generally experienced when wavelengths up to about 420 nm are filtered out since many of the nitro-aromatic compounds absorb radiation that far out into the visible range. During the second exposure, a greater portion of the coating, typically the entire coated area, is struck by radiation with the result that free radicals are generated and polymerization takes place in the areas struck by radiation during the second exposure but not during the first exposure.

The length of time for which the compositions are exposed to radiation may vary upward from fractions of a second. The exposure times will vary, in part, according to the nature and concentration of the polymerizable compound and initiator, and the type of radiation. Exposure can occur over a wide range of temperatures, as for example, from about −80° C. up to about +150° C. with selected compositions. Preferred exposure temperatures range from about −30° to about +35° C. There is an obvious economic advantage to operating the process at room temperature.

Imagewise exposure, for example in preparing printing plates, is conveniently carried out by exposing a layer of the photoactive composition to radiation through a process transparency; that is, an image-bearing transparency consisting solely of areas substantially opaque and substantially transparent to the radiation being used where the opaque areas are substantially of the same optical density; for example, a so-called line or halftone negative or positive. Process transparencies may be constructed of any suitable materials including cellulose acetate film and polyethylene terephthalate film. An example is the preparation of a positive working lithographic plate using the novel system of this invention. In a positive imaging system, polymer is ultimately formed under the opaque areas of the process transparency; that is, the areas not struck by radiation passing through the transparency. Exposure of a plate coated with the nitroaromatic compound-containing photoactive composition to the full spectrum of a mercury-vapor lamp through a cellulose acetate or polyethylene terephalate film negative causes rearrangement of the nitroaromatic compound to a nitrosoaromatic compound in the radiation-struck areas. The areas struck by radiation during the first exposure will become non-image areas since no polymerization will be initiated in these areas.

Removal of the process transparency followed by a second exposure of the plate to radiation substantially limited to wavelengths greater than about 380 nm causes polymerization to occur in the areas which were not struck by radiation during the first exposure. Radiation of this wavelength is insufficiently absorbed by the nitroaromatic compound to rearrange it to a nitroso compound. The portions of the coating exposed in this manner become the polymeric image areas. Development of the doubly exposed plate provides a positive working plate suitable for use in lithography.

The exposed photosensitive layer may be developed by removing the unpolymerized, ethylenically unsaturated compound from the coating, leaving behind a polymeric replica of the original. This may be accomplished by heating the coating under conditions which result in some or all of the volatile components being vaporized, whereby the photopolymer is left behind. The conditions of thermal development selected will depend upon the nature of the substrate, the volatility of the components to be removed, and the thermal stability of the components. Alternatively, development may be achieved by solvent washout, thermal transfer, pressure transfer, or differential adhesion of the exposed versus unexposed areas, and the like. Preferably, polymeric images are developed by solvent washout. Alternatively, they may be developed without washout by differential adhesion of a pigment toner to the tacky unpolymerized areas.

The photopolymerizable compositions of this invention have the advantage that the same compositions used for the two-exposure positive-working applications described above may also be used to form negative polymeric images by the single exposure procedure. For this application, a layer of any of the photopolymerizable nitroaromatic compound-containing compositions described above is exposed through an image-bearing transparency to radiation substantially limited to wavelengths above about 380 nm until polymer is formed in the exposed areas. Unpolymerized portions of the photopolymerizable layer are then removed by solvent washout, or any of the other removal methods described above, to leave a negative polymeric image of the pattern of the transparency employed.

The photopolymerizable compositions of this invention have the very special advantage that the imagewise exposure of the positive-working process can be carried out using polyethylene terephthalate process transparencies. This is possible because the nitroaromatic compounds are sensitive to radiation of wavelength about 366 nm which is readily passed by polyethylene terephthalate film. Most of the previously known sources of nitroso inhibitors in positive-working photopolymerizable compositions have required activation by radiation having wavelengths below about 330 nm which is screened out by polyethylene terephthalate film. Thus, the present invention is useful with the latest, and most preferred, image-bearing transparencies.

The following examples further illustrate the compositions and methods of this invention. All parts and percentages are by weight unless otherwise specified.

EXAMPLE 1

Part A

To 3.5 ml of 1,1,1-trimethylolpropane triacrylate containing about 200 ppm of hydroquinone and/or methylhydroquinone inhibitor was added 0.153 g of o-nitrobenzyl alcohol and 0.021 g of phenanthrenequinone. A layer of the resulting clear solution was doctored onto each of two glass microscope slides, and the coated slides were covered with a thin film of polyethylene terephthalate and another microscope slide. The exposures below were carried out at room temperature.

Part B

One of the slide assemblies described above was exposed through an image-bearing transparency to the total radiation from a 275 watt G.E. sunlamp for one minute at a distance of six inches. This lamp gives radiation of wavelengths in the range of 280 to 600 nm with approximately 40% in the range of 280 to 380 nm. The exposure caused formation of o-nitrosobenzaldehyde in the irradiated areas of the photopolymerizable layer. The image-bearing transparency was then replaced by a filter eliminating all radiation of wavelength below 400 nm (Dow Corning 3-73 filter) and the assembly was again exposed to the same lamp for one minute. The film of polyethylene terephthalate next to the photopolymerizable layer was then peeled off. The presence of a positive polymeric image in the areas not exposed during the first exposure (e.g. areas under the opaque image on the transparency) was demonstrated by lightly dusting the layer with carbon black. The carbon black adhered to the tacky unpolymerized areas containing o-nitrosobenzaldehyde inhibitor and left clear the remaining dry areas which had polymerized during the second exposure.

Part C

The second slide assembly was exposed by a single exposure process through the image-bearing transparency used in Part B to radiation from the sunlamp used in Part B which passed through the filter described in Part B to screen out all radiation below about 400 nm for one minute at a distance of six inches. The areas receiving the filtered radiation polymerized because phenanthrenequinone is an effective photoinitiator with radiation of wavelength about 410 nm. The film of polyethylene terephthalate next to the photopolymerizable layer was peeled off. The presence of a negative polymeric image in the areas struck by radiation coming through the transparency (e.g., in the areas not shielded by the opaque image on the transparency) was demonstrated by lightly dusting the layer with carbon black. The carbon black adhered to the tacky unexposed areas and left the remaining dry, polymerized areas clear.

EXAMPLES 2-18

The following examples illustrate the usefulness of the inventive compositions in a process in which images are formed by photohardening and applying a colorant.

A stock solution was prepared containing the following ingredients:

| Component (Function) | Amount (g) |
| --- | --- |
| Pentaerythritol triacrylate (monomer) containing 0.1-0.25% p-methoxyphenol (inhibitor) | 25 |
| Methyl methacrylate polymer (binder, low mol. wt., density = 1.13 g/cc) | 25 |
| Triethylene glycol diacetate (plasticizer) | 6.5 |
| Methylene chloride (solvent) | 508.5 |

Coating solutions were prepared using 10-g portions of the above stock solution, 2,7-di-t-butyl phenanthrenequinone as photoinitiator, and, in all except the control, an o-nitroaromatic compound as photoinhibitor; the amounts of photoinitiator and photoinhibitor added, calculated as a percentage based on the total solids in the coating, are indicated in Table I.

Each coating solution was coated in duplicate at room temperature on the resin side of a 0.1 mm polyethylene terephthalate film which had been resin-coated by the procedure of U.S. Pat. No. 2,779,684, Example IV. The coating was dried at 55° C. and the dried coating was 0.0076 mm thick. A 0.025 mm cover sheet of polyethylene terephthalate was pressure laminated onto the coating at room temperature. One set of films was then exposed in a vacuum frame through a step wedge process transparency in which the transmittance of radiation between steps increases successively by a factor of $\sqrt{2}$, to radiation above 380 nm to determine conventional photopolymerization speed. The radiation source was a 1000-watt, quartz-iodide lamp, placed 81.2 cm from the sample; the exposure times are listed in Table I.

Following exposure, the polyethylene terephthalate cover sheet was removed and a finely-divided, blue pigment toner was applied to the photopolymer surface. After removing excess toner with a cotton pad, a replica of the step wedge remained. That is, toner did not adhere to polymerized areas, but did to the tacky, unpolymerized portions. Thus, the number of clear, i.e. polymerized, steps found on the replica gave a relative comparison of the photopolymerization speed in the presence of the o-nitroaromatic compound. The results are shown in Table I below.

The second set of films was initially exposed in a vacuum frame through the step wedge process transparency to radiation of wavelength between 310 and 430 nm with approximately 88% between 310 and 380 nm; this initial exposure source was a device containing eight Sylvania® Blacklite Blue lamps (Model No. F15T8-BLB) 5.08 cm from the sample films. This exposure (see Table I for exposure time) was effective in producing aromatic nitroso inhibitor from the o-nitroaromatic compound in the film, in amounts inversely related to the optical densities of the steps on the step wedge. Consequently, when the process transparency was removed, and the same irradiated with actinic radiation having a wavelength greater than 380 nm using the quartz-iodide lamp as above, photopolymerization occurred only where the concentration of nitroso inhibitor was negligible-to-low. Following removal of the cover sheet and toning as above, pigment adhered to the tacky, unpolymerized areas corresponding to those steps which contained a high concentration of nitroso inhibitor from the initial exposure, i.e., the lower numbered steps. The data observed in this two-exposure process are also summarized in Table I.

EXAMPLES 19-20

The following two examples illustrate applicability of the compositions of this invention for preparing lithographic films. In these examples, the unpolymerized areas were completely removed, down to the base substrate, by washing out with an aqueous alkali solution. The polymerized portions, which were not dissolved by the solvent, were opaque since they contained a high concentration of colloidal carbon. Thus, the resulting film could serve as a photomask for further copy preparation, e.g., lithographic films.

Coating solutions were prepared containing the following ingredients (percentage based on total solids):

|  | Amount (g) | % |
|---|---|---|
| Triethylene glycol dimethacrylate containing 100-300 ppm p-methoxyphenol inhibitor | 1.05 | 33.8 |
| Copolymer (1:1) of styrene and maleic anhydride, partially esterified with isopropanol; mol. wt. 1700, acid No. 270 | 1.18 | 37.9 |
| Terpolymer of ethyl acrylate (56%), methyl methacrylate (37%), and acrylic acid (7%); acid No. 76-85, mol. wt. ca. 260,000 | 0.30 | 9.5 |

TABLE I

| Example No. | Photoinhibitor Type | % | Initiator % | Photopolymerization Speed Single Exposure[a] (Steps Toned) | Two Step Exposure[b] (Steps Clear) | Exposure Time (sec) <380nm | Exposure Time (sec) >380nm[f] |
|---|---|---|---|---|---|---|---|
| Control | — | — | 1.0 | 0 | 3 | 0 | 60 |
| 2 | 2-Nitrobenzyl alcohol | 0.5 | 1.0 | <1 | 3 | 60 | 60 |
| 3 | 2-Nitrobenzyl alcohol | 1.0 | 1.94 | 1 | 1 | 60 | 60 |
| 4 | 2-Nitro-4,5-dimethoxy-benzyl alcohol | 0.48 | 1.95 | 6 | 2 | 60 | 60 |
| 5 | 2-Nitrobenzaldehyde | 0.48 | 1.95 | <1 | 1 | 60 | 60 |
| 6 | 2-Nitro-4,5-dimethoxy-benzaldehyde | 0.48 | 1.95 | 6 | 1 | 60 | 60 |
| 7 | 2,4-Dinitro-benzaldehyde | 1.92 | 1.92 | 3 | 1 | 60 | 60 |
| 8 | 2-Nitrostyrene | 1.92 | 1.92 | 2 | 1 | 60 | 60 |
| 9 | 2-Nitro-4,5-dimethoxystyrene | 0.48 | 1.95 | <1 | 1 | 60 | 60 |
| 10 | Alpha-Phenylimino-2-nitrotoluene | 0.48 | 1.95 | 2 | 1 | 60 | 60 |
| 11 | c | 1.92 | 1.92 | <1 | 1 | 60 | 60 |
| 12 | d | 0.48 | 1.95 | 1 | <1 | 60 | 60 |
| 13 | Alpha-Phenylimino-2-nitro-4,5-dimethoxytoluene | 0.48 | 1.95 | 6 | 1 | 60 | 60 |
| 14 | 2-Nitrostyrene oxide | 1.92 | 1.92 | <1 | <1 | 120 | 30 |
| 15 | 2-Nitrocumene | 1.92 | 1.92 | 2 | 3 | 60 | 60 |
| 16 | 2-Nitro-4,5-dimethoxy benzyl chloride | 3.77 | 1.86 | 0 | 2 | 90 | 30 |
| 17 | e | 0.48 | 1.95 | <1 | 2 | 60 | 60 |
| 18 | e | 0.97 | 1.94 | 2 | 2 | 60 | 60 |

Table I Legend $a$ = Number of full $\sqrt{2}$ step wedge steps toned, i.e., not polymerized, tacky.

$b$ = Number of full $\sqrt{2}$ step wedge steps remaining clear, i.e., polymerized, nontacky.

$c$ = 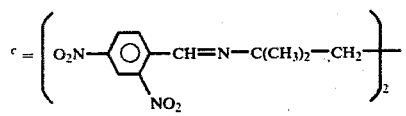

$d$ = 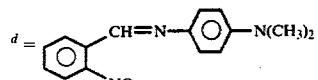

$e$ = 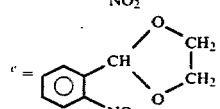

f = for both single and two step exposures.

-continued

| | Amount (g) | % |
|---|---|---|
| Colloidal carbon | 0.30 | 9.5 |
| Triethylene glycol diacetate | 0.10 | 3.3 |
| 2-(o-chlorophenyl)-4,5-di(m-methoxyphenyl)imidazolyl dimer | 0.09 | 2.9 |
| 2-Mercaptobenzothiazole | 0.009 | 0.29 |
| 2,5-Bis(4'-diethylamino-2'-methylbenzylidene)cyclopentanone | 0.036 | 1.2 |
| Photoinhibitor | 0.054 | 1.7 |
| Methylene chloride | 12.7 ml | |

Duplicate coatings were prepared as in Examples 2–18 using a cover sheet of polyethylene terephthalate, 0.013 mm thick. The dried coating thickness was 0.0051 mm.

The negative-working mode for these examples was ascertained in a manner similar to the single exposure tests of Examples 2–18. Thus, one set of films was exposed for 90 seconds through a √2 step wedge, to radiation above 380 nm to determine conventional, negative-working, photopolymerization speed. The exposure device was a commercial nuArc® vacuum frame (Model FT26L) containing a 2000 watt, pulsed xenon source, 43.2 cm from the polymerizable layer. Radiation of wavelengths less than 380 nm was excluded by inserting an appropriate filter between the source and sample; either a Wratten Light Filter 1A or 2C, manufactured by Eastman Kodak Co., was used.

Following exposure, the cover sheet was removed and the unpolymerized steps were washed out with a dilute aqueous solution of $Na_2CO_3$ and $NaHCO_3$, pH=9.3, at 44.4° C. The polymerized steps were readily visible due to the colloidal carbon dispersed through the photopolymer.

The positive-working mode of the compositions was determined by an initial 60-second exposure to radiation, <380 nm, from Blacklite Blue lamps in the configuration described above, through the step wedge process transparency of Examples 2–18 followed by a 90-second exposure to actinic radiation, >380 nm, from the filtered pulses xenon source described above without the step wedge, followed by aqueous alkali washout development as described above. The data observed are shown in Table II.

Table II

Positive/Negative-Working Photopolymerization Speed

| Ex. No. | Photoinhibitor | Positive Mode[a] | Negative Mode[b] |
|---|---|---|---|
| Control | — | — | 8 |
| 19 | 2-Nitro-5-methoxybenzyl alcohol | 4 | 7 |
| 20 | alpha-Phenylimino-2-nitrotoluene | 3 | 5 |

[a] = Number of full √2 step wedge steps washed off and clear i.e., not polymerized.

[b] = Number of full √2 step wedge steps not washed off, i.e., polymerized and black.

Equally satisfactory results were obtained on laminating the above, or similar, compositions at 65° C. to drafting film substrates as described in U.S. Pat. No. 2,964,423. In this manner, either positive- or negative-working, wash-off, sharp, black engineering reproduction films are produced.

EXAMPLE 21

This example illustrates the applicability of the compositions of this invention for making photoresists.

A coating composition was prepared containing the following ingredients (percentages based on total solids):

| Component | Amount (%) |
|---|---|
| Methyl methacrylate polymer (low mol. wt., density = 1.13g/cc) | 50.22 |
| Trimethylolpropane triacrylate (monomer) containing 235-265 ppm hydroquinone (inhibitor) | 33.76 |
| 2-(o-chlorophenyl)-4,5-diphenylimidazolyl dimer | 8.66 |
| Triethylene glycol diacetate | 2.68 |
| 2-Mercaptobenzothiazole | 0.43 |
| 2,5-Bis(4'-diethylamino-2'-methylbenzylidene) cyclopentanone | 1.74 |
| 2-Nitro-4,5-dimethoxybenzaldehyde | 2.60 |

These ingredients were added to enough methylene chloride to give a 10% solids solution. This solution was coated onto 0.025 mm thick polyethylene terephthalate using a doctor knife and air dried; the dried coating thickness was about 0.038 mm. This layer was then laminated to a piece of copper clad, epoxy-fiber glass board substantially as described in U.S. Pat. No. 3,469,982, Ex. I, lines 46–55.

The positive- and negative-working modes were then evaluated by exposing the laminate, through a √2 step wedge process transparency, through the polyester film side, as described in Examples 2–18. The one-step exposure was for 2 minutes to a quartz iodide lamp. The two-step exposures were for one minute to radiation having wavelengths <380 nm, followed by 2 minutes to actinic radiation having wavelengths >380 nm. After exposure, the polyester film was removed by stripping, and the unpolymerized portions of the replica were dissolved away in a 15-sec. spray of 1,1,1-trichloroethane, leaving a protective, polymeric resist on the copper surface. In the single exposure, negative-working mode, areas corresponding to steps 1–6 were polymerized (a resist), while areas under the higher steps were not. In the two-exposure, positive-working mode, however, areas of the replica corresponding to steps 1–4 of the step wedge were clean copper, while the higher steps were polymerized (a resist).

The unprotected copper in both of the above, as taught in U.S. Pat. No. 3,469,982, could be etched with ferric chloride. Then, following removal of the resist, e.g., with $CH_2Cl_2$, printed circuit boards would result, one a positive and the other a negative of the step wedge target.

EXAMPLES 22-24

These examples illustrate the applicability of compositions of this invention containing different photoinhibitors for preparing lithographic films.

A stock solution (10% solids) was prepared containing the following ingredients:

| Component | Amount (g) |
|---|---|
| Trimethylolpropane triacrylate (monomer) containing 235-265 ppm hydroquinone (inhibitor) | 1.64 |
| Triethylene glycol dimethacrylate (monomer) | |

-continued

| Component | Amount (g) |
|---|---|
| containing 235–265 ppm hydroquinone (inhibitor) | 13.82 |
| Copolymer (1:1) of styrene and maleic anhydride, partially esterified with isopropanol; mol. wt. 1700, acid No. 270 | |
| Terpolymer of ethyl acrylate (56%), methyl methacrylate (37%), and acrylic acid (7%), acid No. 76–85, mol. wt. ca. 260,000 | 11.4 |
| Colloidal carbon | |
| Methylene chloride | 541.3 |
| 2-Ethoxyethanol | 20.5 |

Coating solutions were prepared using the above stock solution, 2-(o-chlorophenyl)-4,5-diphenylimidazolyl dimer as the photoinitiator, 2,5-bis(4'-diethylamino-2'-methylbenzylidene)cyclopentanone as sensitizer, and a photoinhibitor or mixture of photoinhibitors as indicated in Table III. The amounts of photoinhibitor, photoinitiator and sensitizer are reported in percentages based on total solids content.

Duplicate coatings were prepared by a procedure similar to that used in Examples 19–20. The coatings were air-dried at room temperature for 30 minutes; the polyethylene terephthalate cover sheet was laminated to the coating at 65.6° C. at a rate of 0.91 meters/minute. Dried coating thicknesses were approximately 0.005 mm.

The negative-working mode was ascertained as described in Examples 19–20, using a nuArc ® 2000 watt xenon source and a Wratten 2C filter to exclude radiation at wavelengths less than 380 nm; exposure times are shown in Table III.

Following exposure, the cover sheet was removed and the unpolymerized steps were washed out with a dilute aqueous solution of $Na_2CO_3$ and $NaHCO_3$, pH=9.3, at 25.5° C., and then rinsed with water at 32° C., accompanied by light rubbing with a sponge. The number of steps polymerized are reported in Table III.

The positive-working mode of the compositions was determined by an initial exposure through the step wedge process transparency of Examples 2–18 to unfiltered radiation from the nuArc ® 2000 watt xenon source containing approximately 25% radiation below 380 nm, followed by an overall exposure to actinic radiation limited to wavelengths above 380 nm from the pulsed xenon source described above with a UV filter, followed by wash out using an aqueous alkali solution in which the unpolymerized areas were completely removed down to the base substrate. The polymerized portions, which were not dissolved by the solvent, were opaque since they contained a high concentration of colloidal carbon. The initial exposure time is shown in Table III. The exposure time for the single-exposure, negative-working mode was identical to the second exposure time for the two-exposure, positive-working process, as indicated in Table III.

TABLE III

| | | | Positive/Negative-Working Photopolymerization Speed | | | | | |
|---|---|---|---|---|---|---|---|---|
| Example No. | Photoinhibitor | | Exposures (sec.) | | Positive Mode[a] | Negative Mode[b] | Photo-initiator % | Sensitizer % |
| | Type | % | <380 nm | >380 nm | | | | |
| 22 | A | 8.3 | 10 | 60 | 2/8 | 4/3 | 8.3 | 0.83 |
| 23 | B | 3.5 | 15 | 45 | 4/9 | 4/4 | 8.7 | 0.87 |
| 24 | A | 2.6 | 5 | 45 | 2/6 | 3/4 | 8.7 | 0.87 |
| | C | 0.87 | | | | | | |

[a] = Number of full $\sqrt{2}$ step wedge steps washed off and clear, i.e., not polymerized/number of steps not totally polymerized.

[a] = Number of full $\sqrt{2}$ step wedge steps not washed off, i.e., polymerized and black/number of steps partially polymerized.

A = 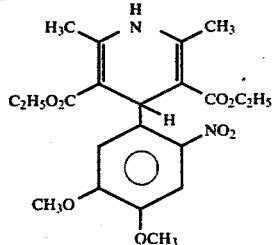

B = 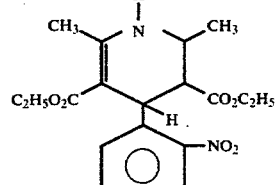

C = 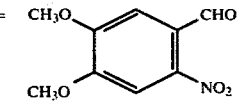

EXAMPLE 25

This example illustrates the applicability of compositions of this invention for preparing positive-working lithographic printing plates, similar to those described by Alles in U.S. Pat. No. 3,458,311.

A photosensitive composition was prepared containing the following ingredients:

| Component | Parts |
|---|---|
| Methyl methacrylate/methacrylic acid copolymer (9:1) | 36.0 |
| Trimethylolpropane triacrylate (monomer) containing 235–265 ppm hydroquinone (inhibitor) | 35.3 |
| Di(2-ethylhexyl) phthalate | 12.3 |
| 2-(o-chlorophenyl)-4,5-diphenyl-imidazolyl dimer | 10.0 |
| 4,5-Dimethoxy-2-nitro-α-phenyliminotoluene | 3.1 |
| 2,5-Bis(4'-diethylamino-2'-methylbenzylidene)-cyclopentanone | 1.5 |
| C.I. Solvent Red 109 | 1.5 |
| Leuco Crystal Violet | 0.3 |

A coating solution was prepared by dissolving the ingredients in enough 2-ethoxyethanol to yield a solution containing 18.6% solids. The solution was then spin coated on an anodized aluminum plate; after drying at 38° C., the dried photopolymerizable coating weight was 20.4 mg/dm$^2$. After being cooled to room temperature, the coated plate was then overcoated with an oxygen-barrier polymer using an aqueous solution (10% solids) of polyvinyl alcohol (medium viscosity, 87–89% hydrolyzed). After drying also at 38° C., the overcoat weight was 18.9 mg/dm$^2$.

The negative- and positive-working modes for the plate were then evaluated by exposure, through a $3\sqrt[3]{2}$ step wedge process transparency, through the overcoat layer, as described in Examples 22–24; the exposure times are shown in Table IV.

Following exposure, the overcoat layer and the unpolymerized steps were washed out (developed) using a solution of sodium carbonate (1.8%) and diethylene glycol monobutyl ether (8%) in distilled water at 22° C. Development was complete in 60 seconds at 25° C. The plate was then rinsed with water, lightly rubbed with a cotton pad, and blotted dry. The results obtained are shown in Table IV.

The polymerized areas on the developed plate accepted conventional lithographic greasy inks and the clear areas of the aluminum support were readily wetted with water to yield a high quality lithographic plate.

EXAMPLE 26

Example 25 was repeated except that the photosensitive composition contained, in addition to the components present in Example 25, 0.04 part of 1,4,4-trimethyl-2,3-diazabicyclo(3.2.2)non-2-ene-N,N'-dioxide as a supplement to the hydroquinone thermal inhibitor. The resulting lithographic printing plate, containing a small amount of superior thermal inhibitor, exhibited increased shelf life and improved thermal stability when compared with the plate of Example 25. The photopolymization speeds obtained are shown in Table IV.

TABLE IV

| Example No. | Exposures (sec.) <380 nm | Exposures (sec.) >380 nm | Positive Mode[a] | Negative Mode[b] |
|---|---|---|---|---|
| 25 | 45 | 90 | 2/6 | 8/14 |
| 26 | 45 | 90 | 3/7 | 7/10 |

[a] = Number of full $\sqrt[3]{2}$ step wedge steps that do not accept greasy ink, i.e., not polymerized/first step that accepts ink to maximum density, i.e., totally polymerized.

[b] = Number of full $\sqrt[3]{2}$ step wedge steps that accept greasy ink to maximum density, i.e., totally polymerized/last step to accept ink, i.e., partially polymerized.

Example 27

This example illustrates the applicability of a composition of this invention for preparing a positive-working relief printing plate similar to those described by Munger in U.S. Pat. No. 2,923,673.

A photosensitive composition was prepared containing the following ingredients:

| Component | Amount (g) |
|---|---|
| Styrene/maleic anhydride copolymer, partially esterified with i-butyl alcohol, acid No. 180, average mol. wt. 20,000, softening point 210° C. | 66.25 |
| Triethylene glycol diacrylate (monomer) containing 0.044 g of p-methoxyphenol (inhibitor) | 22.0 |
| 2-Ethylhexyldiphenyl phosphate | 11.0 |
| 2-Nitro-4,5-dimethoxybenzaldehyde | 0.3 |
| 2,6-Di-t-butyl-4-methylphenol | 0.2 |
| p-Methoxyphenol | 0.15 |
| Phenanthrenequinone | 0.1 |

After blending the above ingredients, the composition was placed on a rubber mill preheated to 100° C., and milled for about 5 minutes to yield a homogeneous mass. The mass was then pressed for 2 minutes onto an anodized aluminum plate using a laminating press at 118° C. and 40,000 psi to yield a photopolymerizable layer or film 0.040-inch (0.1 cm) thick. During lamination a flame-treated film of polyethylene terephthalate, 0.004-inch thick (0.01 cm), was applied as a cover sheet.

The resulting element was then placed in a vacuum frame and the polymer surface was brought into contact with a line process negative. The element was then exposed in a positive-working mode as described in Examples 19–20, except that the imagewise exposure to radiation, <380 nm, from Blacklite Blue lamps was 4.5 minutes. The process transparency was then removed, and the element given an overall exposure for 4 minutes to actinic radiation, >380 nm, from the filtered pulsed xenon source as described in Examples 19–20.

Following exposure, the cover sheet was removed and the element was developed for 3 minutes in a spray of aqueous NaOH (0.04 N) at 41° C. A positive relief image was obtained with raised photopolymeric areas corresponding to the opaque areas of the process negative. The relief wells were 0.025 inch (0.06 cm) in depth; the wells corresponded to the transparent areas of the process negative.

EXAMPLE 28

This example illustrates the applicability of a composition of this invention for preparing a positive-working, thin-film resist particularly useful with microelectronic, semiconductor wafers.

A photosensitive composition was prepared containing the following ingredients:

| Component | Parts |
| --- | --- |
| Methyl methacrylate/methacrylic acid copolymer (9:1) | 59.5 |
| Trimethylolpropane triacrylate (monomer) containing 235-265 ppm hydroquinone (inhibitor) | 24.5 |
| 2-(o-chlorophenyl)-4,5-diphenylimidazolyl dimer | 6.64 |
| Mixture of triethylene glycol dicaproate and triethylene glycol dicaprylate | 6.64 |
| 2-Nitro-4,5-dimethoxybenzaldehyde | 1.82 |
| 2,5-Bis(4'-diethylamino-2'-methylbenzylidene)-cyclopentanone | 0.91 |

A coating solution of the above ingredients was prepared by dissolving them in enough 1,1,2-trichloroethane to yield a solution containing 15% solids. This solution was then coated onto a silicon wafer bearing a silica ($SiO_2$) surface 0.0012 mm in depth. The coating was made using a spin coater at room temperature; when the coater was operated at about 2500 r.p.m. for 45 seconds, a dry photopolymerizable layer or film about 0.0001-inch (0.0025 mm) thick was obtained.

The coated wafer was then imagewise exposed for 4-6 seconds to radiation, <380 nm, through a resolution test target (1951 U.S. Air Force) to a 200-watt, 4-inch, high pressure mercury arc illuminator (Oriel ® Model No. 8010) at a distance of about 13 inches (33 cm) in a vacuum frame. The test target was then replaced with a filter for ultraviolet radiation (as described in Examples 19-20) and the photopolymerizable layer was exposed for 4 minutes to radiation, >380 nm, from the Oriel ® source. The nonpolymerized portions of the layer, corresponding to the transparent areas of the test target, were removed under 20 lbs/in² (1.41 Kg/sq cm) nitrogen pressure via spray development using a mixture of 1,1,1-trichloroethane and isopropanol (90/10 by volume) for 30 seconds, followed by a 5-second spray with the above mixture plus naphtha, and finally with a 10-second spray of naphtha alone. The resulting resist exhibited a resolution of 228 line pairs/nm, an exact replica of the maximum resolution provided by the test target.

After baking the resist one hour at 120° C., the resist-protected silicon wafer was etched 12 minutes at room temperature; the etchant was composed of 210 ml of aqueous (40%) ammonium fluoride, 30 ml of concentrated (49.2%) hydrofluoric acid, and 15 ml of aqueous (0.02%) fluorocarbon surfactant FC-95 (Product of Minn. Mining & Mfg. Co.). The etched wafer was then rinsed with water and dried. The protective resist was then removed (stripped) with Caro's acid at 140°-150° C. for 30 minutes to yield a silica pattern on the silicon wafer.

EXAMPLE 29

A photosensitive composition was prepared containing the following ingredients:

| Components | Parts |
| --- | --- |
| Methyl methacrylate/methacrylic acid copolymer (9:1) | 60.86 |
| Trimethylolpropane triacrylate (monomer) containing 235-265 ppm hydroquinone inhibitor | 21.31 |
| Triethylene glycol dicaproate and triethylene glycol dicaprylate | 6.75 |
| 2-(o-chlorophenyl)-4,5-diphenylimidazolyl dimer | 6.18 |
| 1-(2'-nitro-4',5'-dimethoxy)phenyl-1-(4-methoxyphenoxy)ethane | 2.81 |
| 2,5-bis(4'-diethylamino-2'-methylbenzylidene)-cyclopentanone | 0.90 |
| C. I. Solvent Red 109 | 0.95 |
| Leuco Crystal Violet | 0.19 |
| 1,4,4-trimethyl-2,3-diazabicyclo(3.2.2)non-2-ene-N,N'-dioxide | 0.05 |

A coating solution was prepared by dissolving the components in enough 2-ethoxyethanol to obtain a solution containing 19% solids. The solution was spin-coated onto an anodized aluminum plate; after drying at 38° C., the dried photopolymerizable coating weight was 20 mg/dm². After the plate was cooled to room temperature, it was overcoated with an oxygen-barrier polymer using an aqueous solution (10% solids) of polyvinyl alcohol (medium viscosity, 87-89% hydrolyzed). After drying at 38° C., the overcoat weight was 19 mg/dm².

The negative- and positive-working modes for the plates were then evaluated by exposure, through a 3√2 step wedge transparency in contact with the plate in a vacuum frame, for 20 units with a 2 Kw Hg photopolymer lamp in a Berkey Askor unit where the distance from plate to bulb is 96.5 cm. Part of the plate was blocked off with a piece of black polyethylene film. The transparency was then removed and placed in the area where the black film had been, a UV filter that transmits light above 420 nm was placed over the plate, and an overall exposure to visible light with a 100 unit exposure with the same source was made. The plate was developed as in Example 25 for 30 seconds at 22° C., rinsed with water while lightly rubbing with a cotton pad, and blotted dry. The positive image consisted of two completely unpolymerized steps (steps 1 and 2). The negative image consisted of an image where the last partially polymerized step was step 12.

The polymerized areas on the developed plate accepted conventional lithographic greasy inks and the clear areas of the aluminum support were readily wetted with water to yield a high quality positive and negative working lithographic plate.

The embodiments of the invention in which an exclusive property or privilege is claimed are defined as follows:

1. A photopolymerizable coating composition in which the photopolymerizable and photosensitive components consist essentially of
   (a) normally nongaseous, ethylenically unsaturated compound selected from the group consisting of unsaturated esters of polyols, unsaturated amides, vinyl esters and unsaturated aldehydes capable of addition polymerization by free-radical initiated chain propagation,
   (b) 0.004 to 0.7 part by weight, per part of component (a), of nitroaromatic compound of the formula

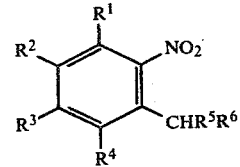

wherein $R^1$, $R^2$, $R^3$ and $R^4$, alike or different, are H, OH, halogen, $NO_2$, CN, alkyl of 1 to 18 carbons, alkoxy in which the alkyl is of 1 to 18 carbons, acyloxy of 2–7 carbons, aryl of 6 to 18 carbons, benzyl, halogen-substituted phenyl, polyether of 2 to 18 carbons and 2 to 10 oxygens, dialkylamino in which each alkyl is of 1 to 18 carbons, thioalkyl in which the alkyl is of 1 to 18 carbons, or thioaryl in which the aryl is of 6 to 18 carbons, $R^2$ and $R^3$, taken together, are $-OCH_2O-$ or $-O(CH_2CH_2O)_{\overline{q}}$ in which q is an integer from 1 to 5, or any two of $R^1$, $R^2$, $R^3$ and $R^4$, taken together, are the residue of a second benzene ring fused onto the benzene nucleus, with the proviso that not more than one of $R^1$, $R^2$, $R^3$ and $R^4$ is OH or $NO_2$, $R^5$ is H, alkyl of 1 to 18 carbons, halogen, phenyl, or alkoxy in which the alkyl is of 1 to 18 carbons, $R^6$ is H, OH, alkyl of 1 to 18 carbons, phenyl, alkoxy in which the alkyl is of 1 to 18 carbons, or aryloxy of 6 to 18 carbons unsubstituted or substituted with halogen, alkyl of 1 to 6 carbons, or alkoxy of 1 to 6 carbons, with the proviso that only one of $R^5$ and $R^6$ is H, or $R^5$ and $R^6$ taken together are $=O$, $=CH_2$, $-O-CH_2-$, $=NC_6H_5$, $=NC_6H_4N(alkyl)_2$ in which each alkyl is of 1 to 18 carbons, $-O-C_2H_4-O-$, $=N$ (alkyl) in which the alkyl is of 1 to 6 carbons, $=N$(hydrocarbylene)

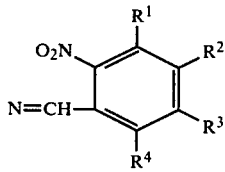

in which the hydrocarbylene group is of 1 to 18 carbons, or

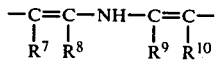

in which $R^8$ and $R^9$, alike or different, are H or alkyl of 1 to 4 carbons, and $R^7$ and $R^{10}$, alike or different, are $-CN$, $-COR^{11}$ in which $R^{11}$ is alkyl of 1 to 5 carbons, or $-COOR^{12}$ in which $R^{12}$ is alkyl of 1 to 6 carbons which may be interrupted by an oxygen atom, alkenyl of 2 to 5 carbons, or alkynyl of 2 to 5 carbons, or $R^7$ and $R^8$ together, or $R^9$ and $R^{10}$ together, complete a 6-membered carbocyclic ring containing a keto group, and (c) 0.001 to 10 parts by weight, per part of component (a), of an organic, radiation-sensitive, free-radical generating system, activatable by actinic radiation that does not significantly rearrange the nitroaromatic compound to an inhibitor of free-radical polymerization.

2. The composition of claim 1 in which component (a) has a boiling point above 90° C. and contains 2–5 terminal ethylenic groups.

3. The composition of claim 2 in which component (c) has at least one component having an active radiation absorption band with a molar extinction coefficient of at least 50 within the range of greater than 380 to 800 nm.

4. The composition of claim 3 which also contains 10 to 80% by weight, based on the total solids content, of a polymeric binder.

5. The composition of claim 4 in which component (b) is 2-nitro-4,5-dimethoxybenzaldehyde.

6. The composition of claim 4 in which component (a) is an unsaturated ester of a polyol and an α-methylenecarboxylic acid.

7. The composition of claim 6 in which component (b) is of the formula in which $R^1$ is H or methoxy;

$R^2$ and $R^3$ are H, alkoxy of 1 to 6 carbons, polyether of 2 to 18 carbons and 2 to 10 oxygens, alkyl of 1 to 6 carbons, or acetoxy; or $R^2$ and $R^3$, taken together, are $-OCH_2O-$ or $-O-CH_2CH_2O)_5$;

$R^4$ is H;

$R^5$ is H, alkyl of 1 to 6 carbons, alkoxy of 1 to 6 carbons, or phenyl;

$R^6$ is OH, alkoxy of 1 to 6 carbons, or phenoxy substituted with up to three chlorines, alkyls of 1 to 6 carbons, or alkoxys of 1 to 6 carbons; or $R^5$ and $R^6$, taken together, are $=O$, $=NC_6H_5$, $=N$ (hydrocarbylene)

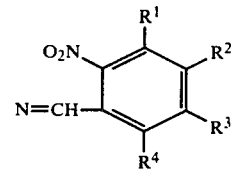

in which the hydrocarbylene group is of 2 to 6 carbons, $=N$ (alkyl) in which alkyl is n-alkyl of 1 to 6 carbons or t-butyl, or

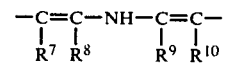

in which $R^8$ and $R^9$ are alike and are H or methyl, and $R^7$ and $R^{10}$ are alike and are $-CN$, $-COR^{11}$ in which $R^{11}$ is methyl or ethyl, or $-COOR^{12}$ in which $R^{12}$ is methyl or ethyl.

8. The composition of claim 7 in which the α-methylenecarboxylic acid is selected from the group consisting of acrylic and methacrylic acids.

9. The composition of claim 8 in which component (a) is trimethylolpropane triacrylate.

10. The composition of claim 8 in which component (b) is of the formula in which $R^1$ and $R^4$ are H;

$R^2$ and $R^3$ are alike and are alkoxy of 1 to 6 carbons;

$R^5$ is H, or alkyl of 1 to 6 carbons;

$R^6$ is alkoxy of 1 to 6 carbons, or phenoxy substituted with up to two alkoxys of 1 to 6 carbons; or $R^5$ and $R^6$, taken together, are $=O$ or $=NC_6H_5$.

11. The composition of claim 10 in which component (c) is present in the amount of 0.01 to 2 parts by weight per part of component (a).

12. The composition of claim 11 in which component (c) includes a compound selected from the group consisting of phenanthrenequinones and 2,4,5-triarylimidazolyl dimers.

13. The composition of claim 12 in which component (c) includes a 2,4,5-triarylimidazolyl dimer, a hydrogen donor, and a visible sensitizer.

14. The composition of claim 12 in which component (c) is 2-(o-chlorophenyl)-4,5-diphenylimidazolyl dimer.

15. The composition of claim 11 in which component (b) is present in the amount of 0.04 to 0.15 part by weight per part of component (a).

16. The composition of claim 15 in which any alkyl groups in component (b) are of 1 to 6 carbons.

17. The composition of claim 16 in which the polymeric binder is selected from the group consisting of vinyl addition polymers containing free carboxylic acid groups, polyacrylate esters and poly-α-alkylacrylate esters.

18. The composition of claim 17 in which component (c) has at least one component that has an active radiation absorption band with a molar extinction coefficient of at least 50 within the range of 400 to 600 nm.

19. The composition of claim 18 in which component (a) is trimethylolpropane triacrylate, component (b) is 2-nitro-4,5-dimethoxybenzaldehyde and component (c) is 2-(o-chlorophenyl-4,5-diphenylimidazolyl dimer.

* * * * *